(12) United States Patent
Yang et al.

(10) Patent No.: US 10,971,993 B2
(45) Date of Patent: Apr. 6, 2021

(54) FAULT DETECTION

(71) Applicant: Ford Global Technologies, LLC, Dearborn, MI (US)

(72) Inventors: Shuitao Yang, Canton, MI (US); Yan Zhou, Canton, MI (US); Baoming Ge, Okemos, MI (US); Lihua Chen, Northville, MI (US); Fan Xu, Novi, MI (US); Mohammed Khorshed Alam, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 522 days.

(21) Appl. No.: 15/669,334

(22) Filed: Aug. 4, 2017

(65) Prior Publication Data
US 2019/0044429 A1 Feb. 7, 2019

(51) Int. Cl.
| | |
|---|---|
| *H02M 1/32* | (2007.01) |
| *B60R 16/033* | (2006.01) |
| *H02M 7/5387* | (2007.01) |
| *G01R 31/00* | (2006.01) |
| *H02P 29/024* | (2016.01) |
| *G01R 31/42* | (2006.01) |
| *G01R 31/50* | (2020.01) |
| *H02M 7/5395* | (2006.01) |
| *H02M 1/00* | (2006.01) |
| *H02P 27/08* | (2006.01) |

(52) U.S. Cl.
CPC .............. *H02M 1/32* (2013.01); *B60R 16/033* (2013.01); *G01R 31/00* (2013.01); *G01R 31/42* (2013.01); *G01R 31/50* (2020.01); *H02M 7/5387* (2013.01); *H02M 7/5395* (2013.01); *H02P 29/0241* (2016.02); *G01R 31/006* (2013.01); *H02M 2001/0009* (2013.01); *H02P 27/08* (2013.01)

(58) Field of Classification Search
CPC .... G01R 27/025; G01R 31/00; G01R 31/025; G01R 31/343; G01R 31/40; H02M 1/32; H02M 2001/0009; H02M 7/5387; H02M 7/5395
See application file for complete search history.

(56) References Cited

U.S. PATENT DOCUMENTS

| | | | |
|---|---|---|---|
| 8,232,752 B2 | 7/2012 | Kezobo et al. | |
| 8,947,838 B2 | 2/2015 | Yamai et al. | |
| 9,019,673 B2 | 4/2015 | Varma et al. | |
| 9,360,515 B2 | 6/2016 | Hirono | |
| 2014/0152224 A1* | 6/2014 | Enomoto | H02P 29/0241 318/490 |
| 2018/0254731 A1* | 9/2018 | Ishita | H02M 7/5375 |
| 2019/0044429 A1* | 2/2019 | Yang | G01R 31/50 |

* cited by examiner

Primary Examiner — Rexford N Barnie
Assistant Examiner — Elim Ortiz
(74) Attorney, Agent, or Firm — David B. Kelley; Brooks Kushman P.C.

(57) ABSTRACT

A vehicle includes an inverter having a supply bus including a contactor operable to conduct current through a resistive element connected to a capacitive element having a voltage supplied by a battery. The vehicle includes a controller configured to energize a first gate of the inverter. The energization is responsive to the voltage exceeding a threshold. The controller is configured to detect current flow between a first phase associated with the gate and the bus based on a voltage drop associated with the voltage.

17 Claims, 8 Drawing Sheets

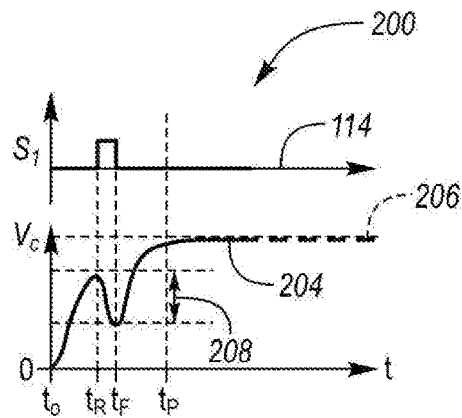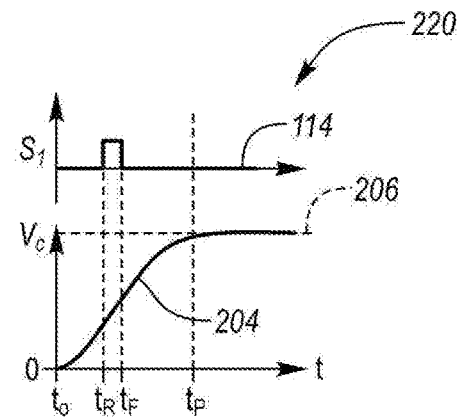
FIG. 3A             FIG. 3B
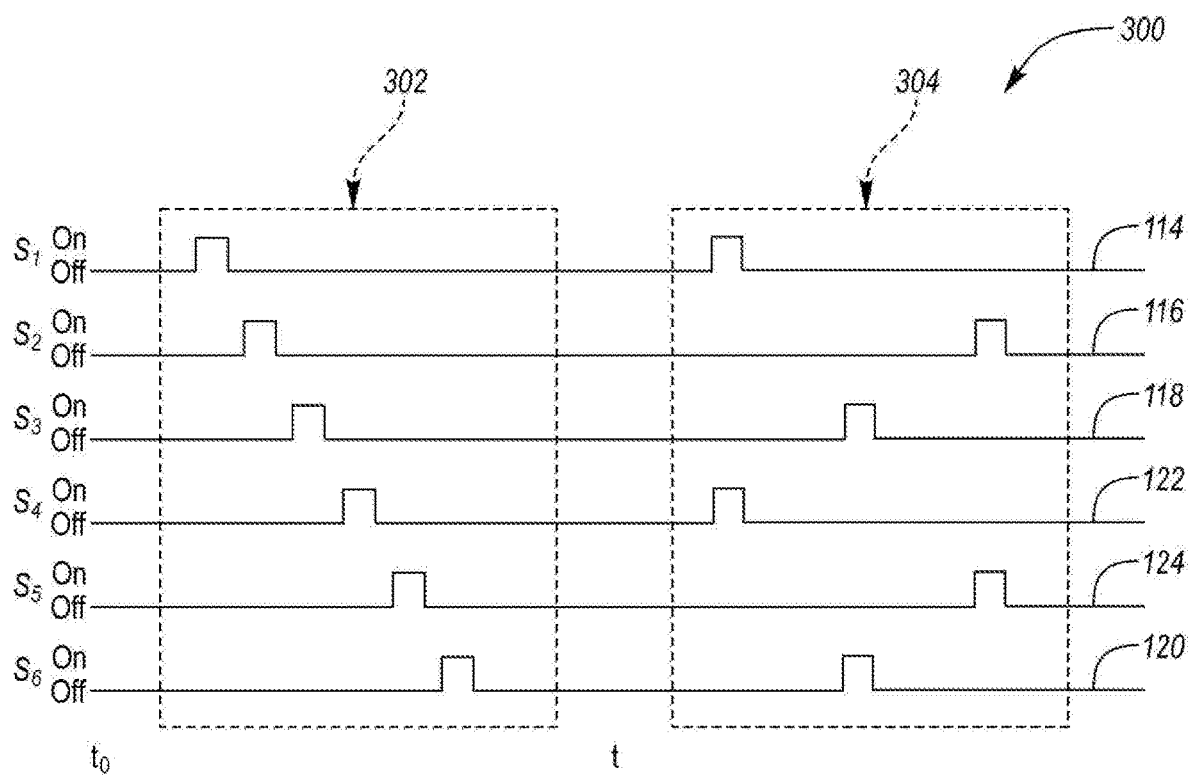
FIG. 4

FAULT DETECTION

TECHNICAL FIELD

This disclosure relates to fault detection of inverters and electric machines.

BACKGROUND

Faults may occur in inverter and electric machine systems. For example, short circuits may form between a supply bus and a phase lead. Short circuits may also form between phases. Similarly, open circuits may form among phases or between the supply bus and a phase lead.

SUMMARY

A vehicle includes an inverter having a supply bus including a contactor operable to conduct current through a resistive element connected to a capacitive element having a voltage supplied by a battery. The vehicle includes a controller configured to energize a first gate of the inverter. The energization is responsive to the voltage exceeding a threshold. The controller is configured to detect current flow between a first phase associated with the gate and the bus based on a voltage drop associated with the voltage.

A vehicle includes an inverter having a bus including a contactor operable to conduct current through a resistive element connected to a capacitive element having a voltage supplied by a battery. The vehicle includes a controller configured to, responsive to the voltage reaching an operational plateau, energize a first gate pair of the inverter, and responsive to absence of current flowing through phases associated with the first gate pair, indicate a fault.

A vehicle includes an inverter having a bus including a contactor operable to conduct current through a resistive element connected to a capacitive element having a voltage supplied by a battery. The vehicle includes a controller configured to energize a first gate pair of the inverter. The energization is responsive to the voltage reaching an operational plateau. The controller is configured to indicate a fault. The fault may be indicated responsive to absence of current flowing through phases associated with the first gate pair.

BRIEF DESCRIPTION OF THE DRAWINGS

FIG. 3A is a graph depicting a short measured by closure of a switch and a drop in bus voltage;

FIG. 3B is a graph depicting normal behavior of bus voltage after closure of a switch;

FIG. 4 is a graph depicting an inverter switching sequence for detecting faults;

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Controllers are used to energize gates of inverter switches to generate waveforms used by electric machines. Monophase or multiphase inverter and electric machine systems are prone to faults among the various phases and supply busses. Short circuit faults may occur between the phases or between the phases and the supply bus. Additionally, open circuit faults may occur with one or more of the phases. Detection of faults at full supply bus power may cause increased damage to drive system circuitry.

A contactor may be used to direct current through a resistive element or resistor to pre-charge a capacitive element or DC link capacitor. The contactor may be a relay or other switch used to selectively connect the pre-charge circuit and normal operation circuit. The pre-charge circuit may be used during vehicle startup to control charging of the capacitive element or DC link capacitor. The resistive element may be any resistive component (e.g., resistor, resistive wire). The resistance of the resistive element may be pre-determined. The capacitive element may be a DC link capacitor used to smooth fluctuations in bus supply voltage.

Figure 1:
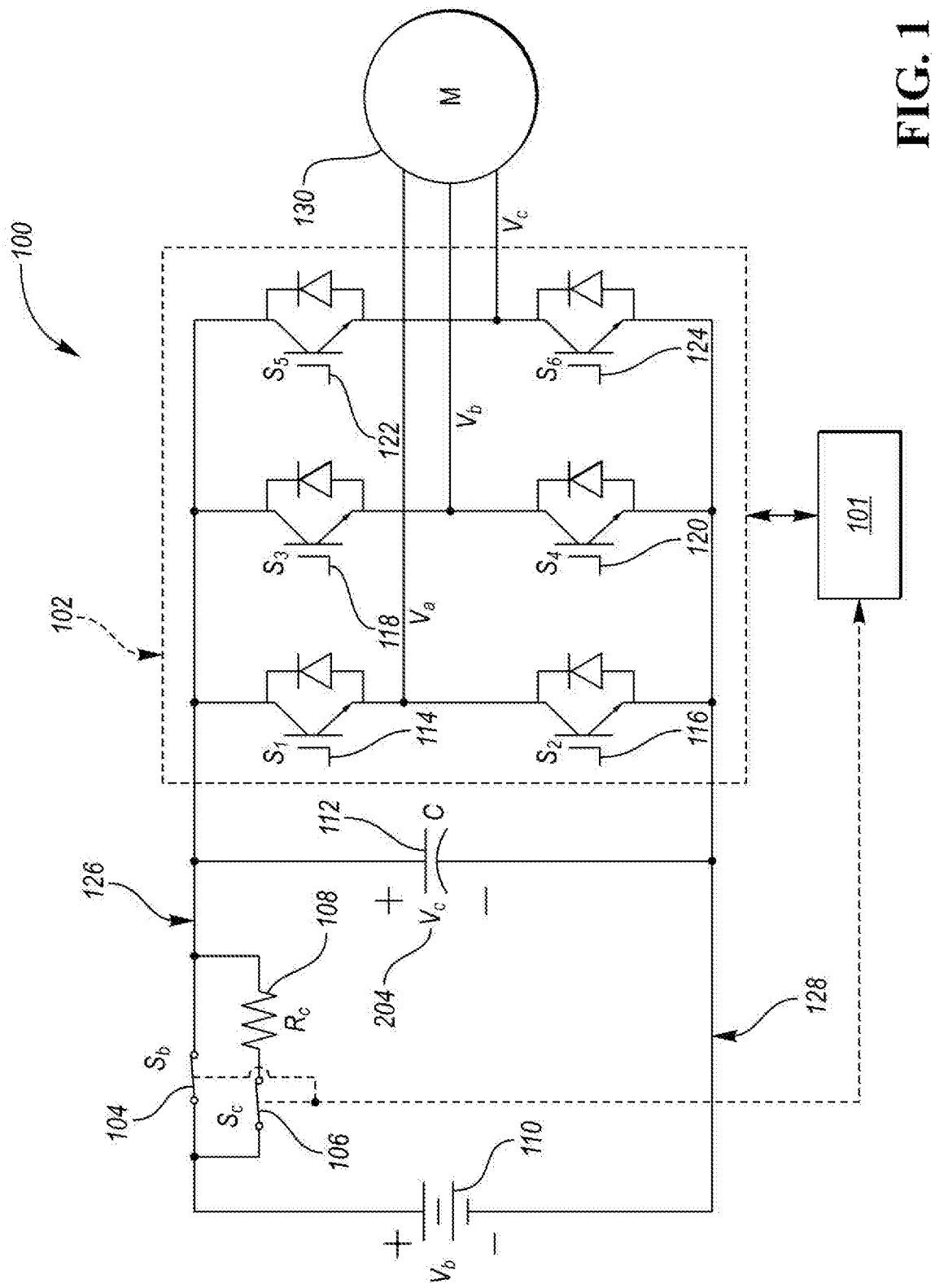
FIG. 1 is a schematic diagram of an inverter for an electric machine.

Referring to FIG. 1, an electrical drive system 100 of a vehicle is shown. The electrical drive system 100 includes a network of switches having gates 114, 116, 118, 120, 122, 124 forming an inverter 102. Each of the switch pairs (e.g., $S_1$, $S_2$) form output phases (i.e., $V_a$, $V_b$, $V_c$) of the inverter 102. The output phases drive the electric machine 130. The rails 126, 128 of the supply bus voltage 204 provides direct current to the switches. The supply bus voltage 204 is powered by a direct current energy source or battery 110. Any type of direct current source may be used. The supply bus voltage 204 has a resistive element 108 and a capacitive element 112. Under normal operation, the main contactor 104 is closed to provide full power availability to the supply bus voltage 204, and the pre-charge contactor 106 is open. Under pre-charge operation, the main contactor 104 is open and the pre-charge contactor 106 is closed. During pre-charge operation, battery power is limited by the resistive element 108 to slowly charge the DC link capacitor 112.

Figure 2A:
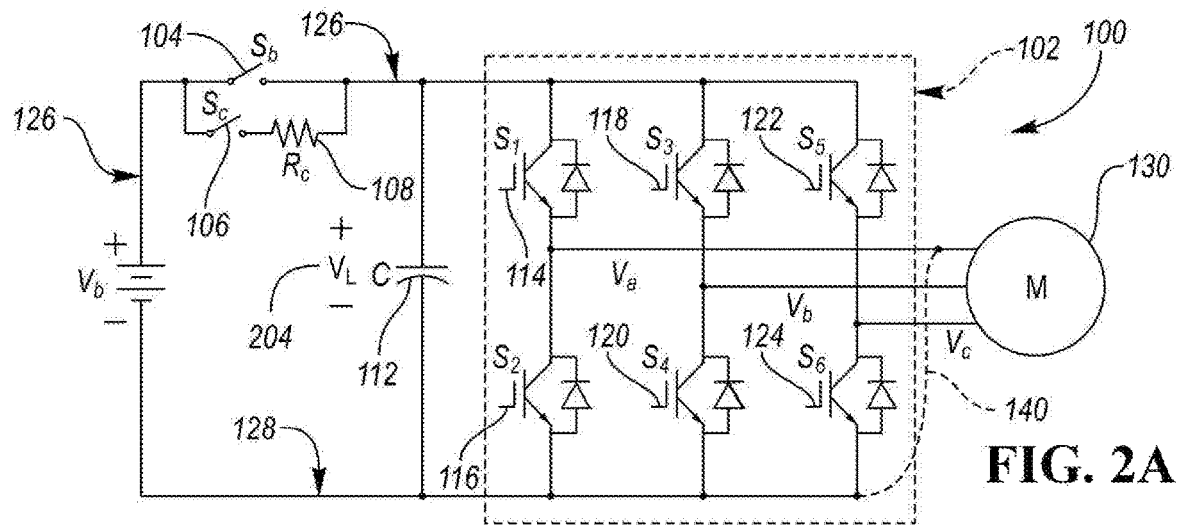
FIG. 2A is a schematic diagram of an inverter for an electric machine having a bus to phase fault.
Figure 2B:
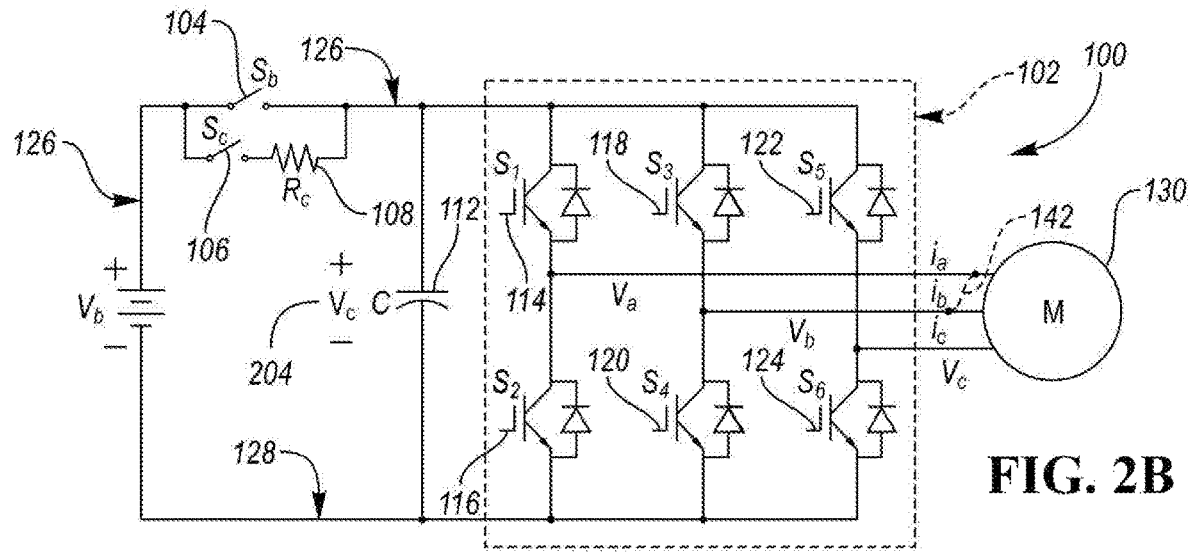
FIG. 2B is a schematic diagram of an inverter for an electric machine having a phase to phase fault.
Figure 2C:
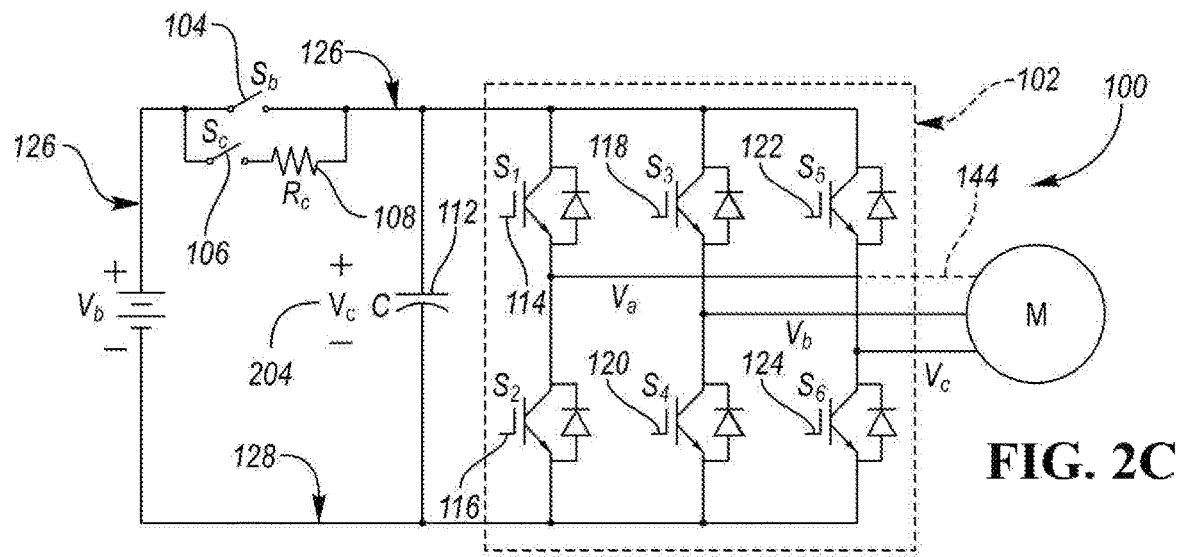
FIG. 2C is a schematic diagram of an inverter for an electric machine having an open circuit fault.

Referring to FIGS. 2A-2C, faults are shown. FIG. 2A one example of a supply bus and phase short circuit fault 140 between the supply bus and output phase $V_a$ or a fault caused internally by the inverter switches. FIG. 2B one example of a phase to phase short circuit fault 142 between the output phase $V_a$ and output phase $V_b$. FIG. 2C one example of an open circuit fault 144 between the electric machine 130 and the phase lead $V_a$.

Referring to FIGS. 3A and 3B, graph 200 depicts abnormal supply bus voltage 204 behavior that indicates a short circuit fault, and graph 220 depicts normal supply bus voltage 204 behavior that indicates a short circuit fault is not present. As one example, the gate 114 for $S_1$ is energized for a duration between $t_R$ (e.g., rising and energizing) and $t_F$ (e.g., falling and deenergizing) edges during the pre-charge cycle of the DC link capacitor 112. The pre-charge cycle may have a voltage plateau 206 for the supply bus voltage 204. At $t_0$, the pre-charge contactor 106 is closed, increasing the supply bus voltage 204. At $t_r$, the gate 114 of $S_1$ is energized by a gate driver of the controller. At $t_f$, the gate 114 of $S_1$ is deenergized by a gate driver of the controller. Under normal operation, the supply bus voltage 204 will not substantially drop in response to the energization of the gate 114. If a short circuit fault is present, e.g., phase A output to the negative DC bus 128 short circuit or switch $S_2$ is under short circuit fault conditions, the supply bus voltage 204 will drop greater than an expected voltage drop 208. The threshold 208 may be based on the voltage 204 at the time of the gate 114 energization. If the voltage drop is greater than the threshold 208, indication of a fault is provided.

FIG. 4 is a timing diagram 300 including switch gate energization intervals. After the pre-charge contactor is closed at $t_0$, the controller is configured to energize the gates 114, 116, 118, 120, 122, 124 of the inverter 102. To test for short circuit faults, as discussed relative to FIG. 2A, the switches are sequentially energized to detect bus 204 to phase short circuits during time period 302. Additionally, gates 114, 116, 118, 120, 122, 124 of the inverter 102 are energized in switch pairs to test for phase to phase short circuit faults during time period 304. The controller may be configured to test for phase to phase or phase to bus faults in reverse order.

Figure 5:
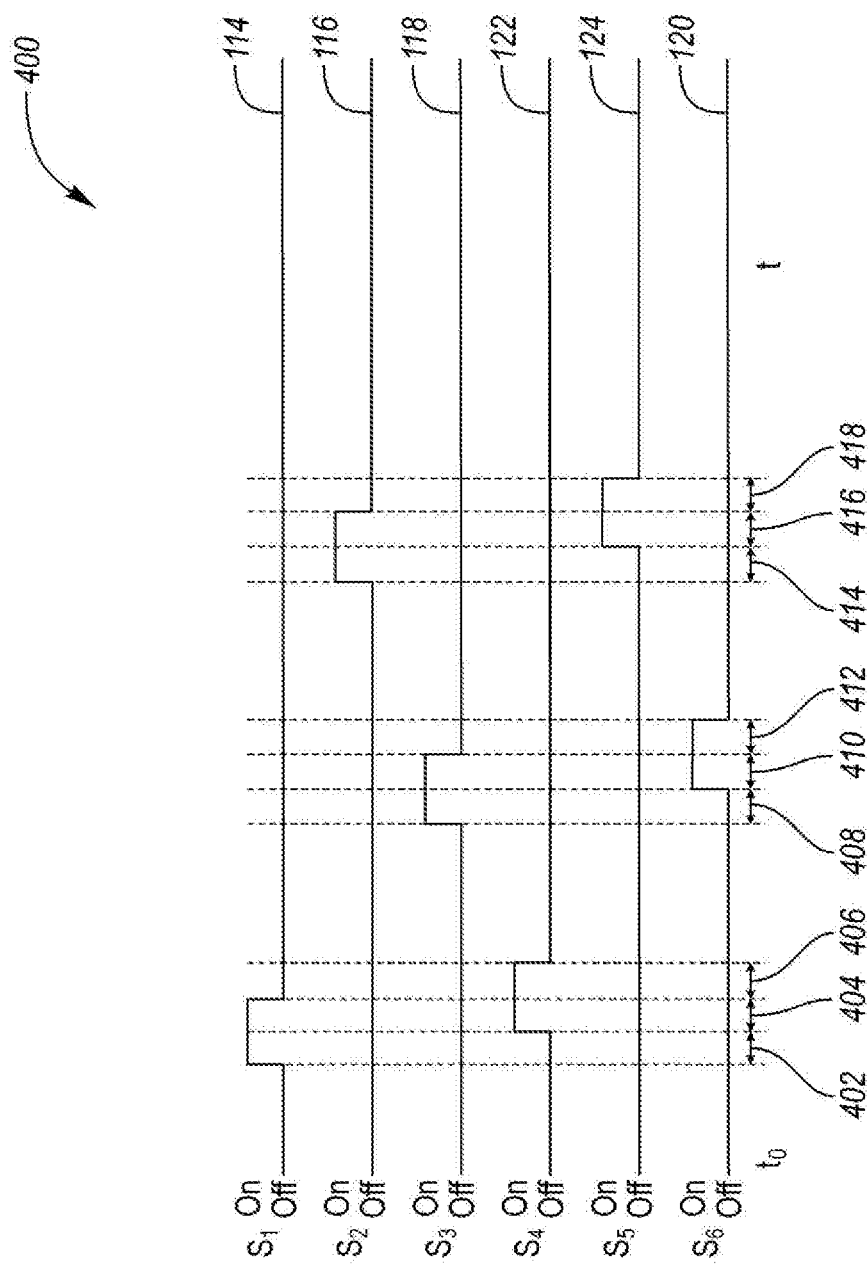
FIG. 5 is a graph depicting a switch energization sequence having overlapped energization durations for detecting multiple faults.

FIG. 5 is a timing diagram 400 including gate energization intervals. After the pre-charge contactor is closed at $t_0$, the controller is configured to energize the gates 114, 116, 118, 120, 122, 124 of the inverter 102. As shown, the phase to phase and phase to bus fault detection testing time periods 302, 304 of FIG. 4 may be combined. Timing diagram 400 depicts gate energization sequences that overlap to test for both phase to phase and phase to bus faults without delay or intermission. The gate 114 for $S_1$ is energized during duration 402 and duration 404, and the gate 120 for $S_4$ is energized during duration 404 and duration 406. During duration 402, a bus to phase short related to $S_1$ is detected. During duration 404, a phase to phase short related to $S_1$ and $S_4$ is detected. During duration 406, a bus to phase short related to $S_4$ is detected. The gate 118 for $S_3$ is energized during duration 408 and duration 410, and the gate 124 for $S_6$ is energized during duration 410 and duration 412. During duration 408, a bus to phase short related to $S_3$ is detected. During duration 410, a phase to phase short related to $S_3$ and $S_6$ is detected. During duration 412, a bus to phase short related to $S_6$ is detected. The gate 122 for $S_5$ is energized during duration 414 and duration 416, and the gate 116 for $S_2$ is energized during duration 416 and duration 418. During duration 414, a bus to phase short related to $S_5$ is detected. During duration 416, a phase to phase short related to $S_5$ and $S_2$ is detected. During duration 418, a bus to phase short related to $S_2$ is detected.

Figure 6:
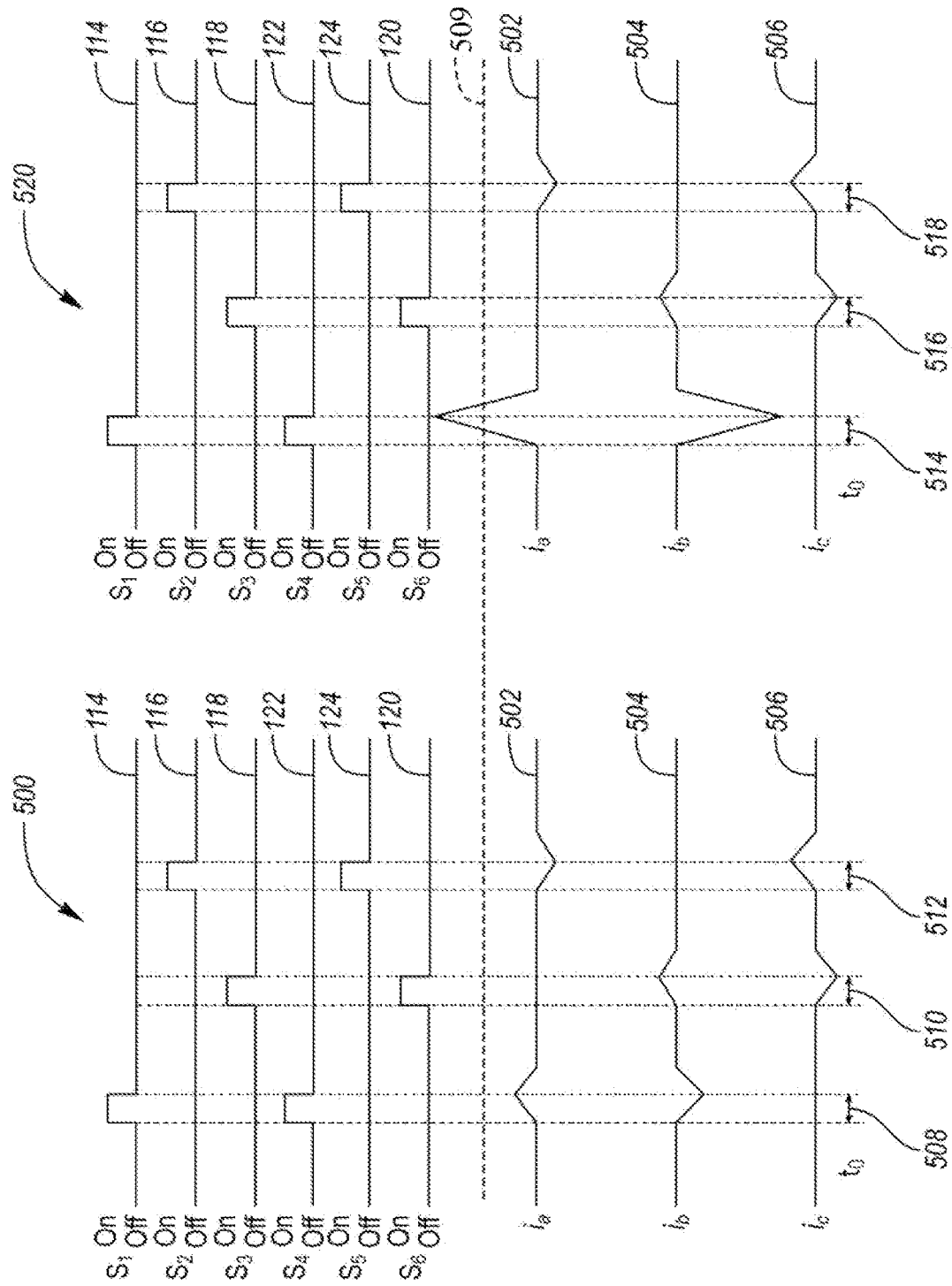
FIG. 6A is a graph depicting a switch energization sequence for detecting short circuits, indicating normal current flow changes.
FIG. 6B is a graph depicting a switch energization sequence for detecting short circuits, indicating abnormal current flow changes.

FIGS. 6A and 6B depict a normal timing diagram 500 and an abnormal timing diagram 520. The diagrams 500, 520 are similar to FIG. 4, which includes switch energization intervals. Although applicable to bus to phase short detection, gates 114, 116, 118, 120, 122, 124 of the inverter 102 are energized, as shown, in switch pairs to test for phase to phase short circuit faults during time durations 508, 510, 512 after the pre-charge contactor is closed. Faults are detected through each of the phases by an increased current flow from controller output currents 502, 504, 506. If the current threshold 509 is exceeded, indication of a fault may be provided.

Figure 7:
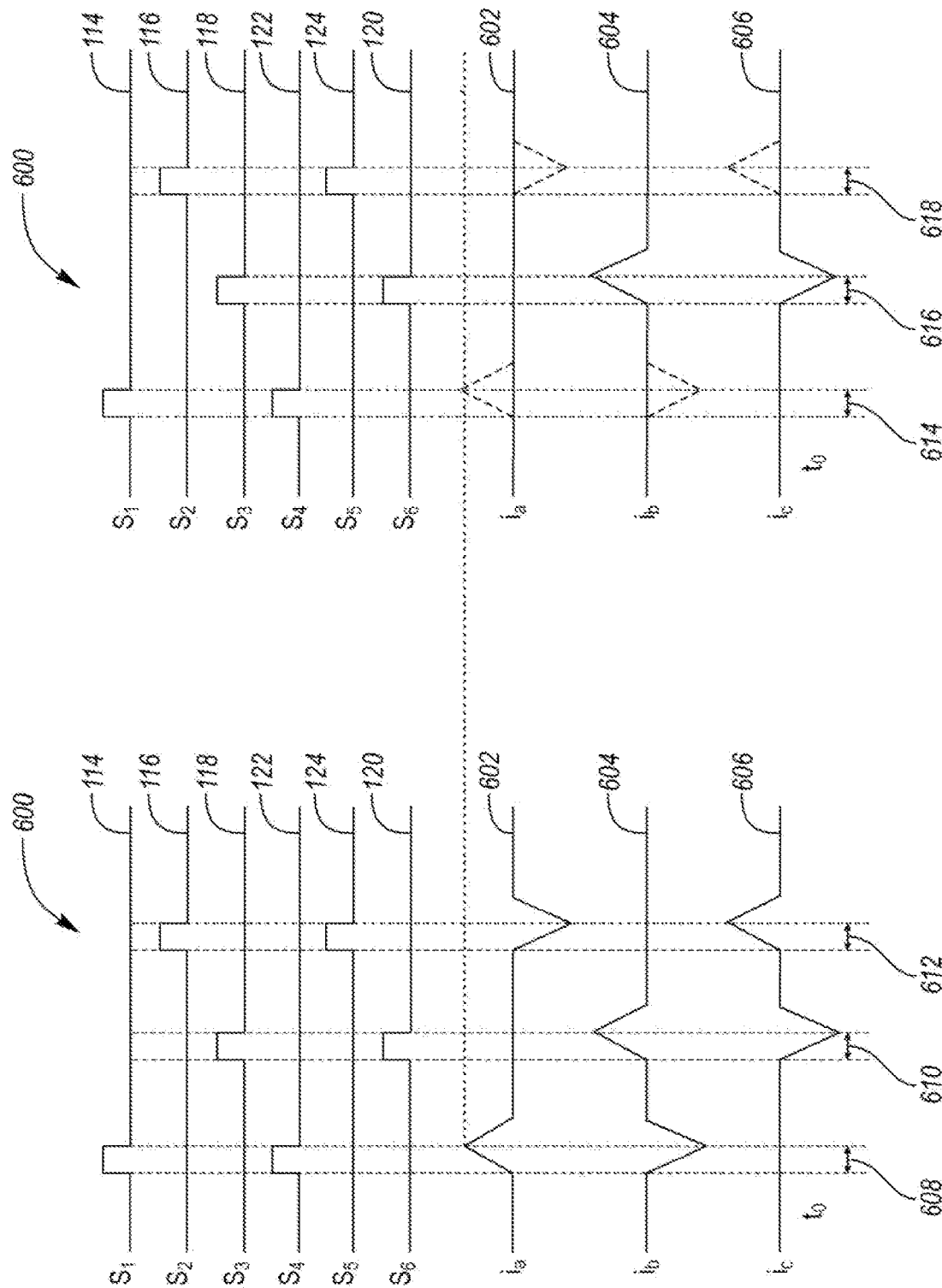
FIG. 7A is a graph depicting a switch energization sequence for detecting open circuits, indicating normal current flow changes.
FIG. 7B is a graph depicting a switch energization sequence for detecting open circuits, indicating abnormal current flow changes.

FIGS. 7A and 7B depict a normal timing diagram 600 and an abnormal timing diagram 620. The diagrams 600, 620 are similar to FIG. 4, which includes switch energization intervals. Although applicable to bus to phase short detection, gates 114, 116, 118, 120, 122, 124 of the inverter 102 are energized, as shown, in switch pairs to test for phase to phase open circuit faults during time durations 608, 610, 612 after the pre-charge contactor is closed. The open circuit faults are shown as phantom lines. A phase 602, 604, 606 may be identified as including an open circuit fault when both switches associated with the given phase (e.g., $S_1$ and $S_2$), as switched in pairs both do not conduct electric current. For example, the gates 114, 120 associated with $S_1$ and $S_4$ are energized together and the gates 116, 122 associated with $S_2$ and $S_5$ are energized together. The absence of current conduction when both pairs are individually energized indicates that a phase $i_a$ 602 fault has occurred. Any combination of gates or switches may be energized in any of the detection methods and schemes to achieve the same results. As one non-limiting example, $S_1$ may be paired with $S_6$, and $S_2$ may be paired with $S_3$ to similarly identify similar open and short circuit faults. The order of energization may be adjusted to improve efficiency or address other factors (e.g., heat dissipation).

Figure 8:
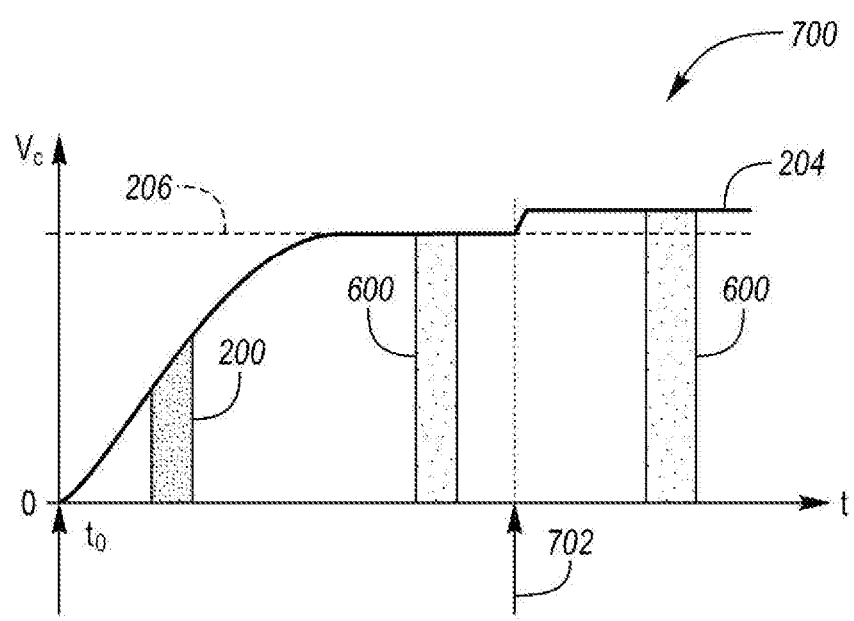
FIG. 8 is a graph depicting timing of switch energization against DC link capacitor voltage.

FIG. 8 includes a graph 700 with fault detection times 200, 600. The short circuit fault detection time 200 may occur after the pre-charge circuit contactor 106 is closed at $t_0$ and before the voltage $V_c$ 204 reaches operational plateau 206. The open circuit fault detection time 600 may occur after the pre-charge circuit contactor 106 is closed at $t_0$ and before the voltage $V_c$ 204 reaches plateau 206. At time 702, the main contactor closes to give direct access to the voltage source 110. The open circuit fault detection time 600 may occur after the main contactor 104 is closed at time 702 and before the voltage $V_c$ 204 reaches plateau 206.

Figure 9:
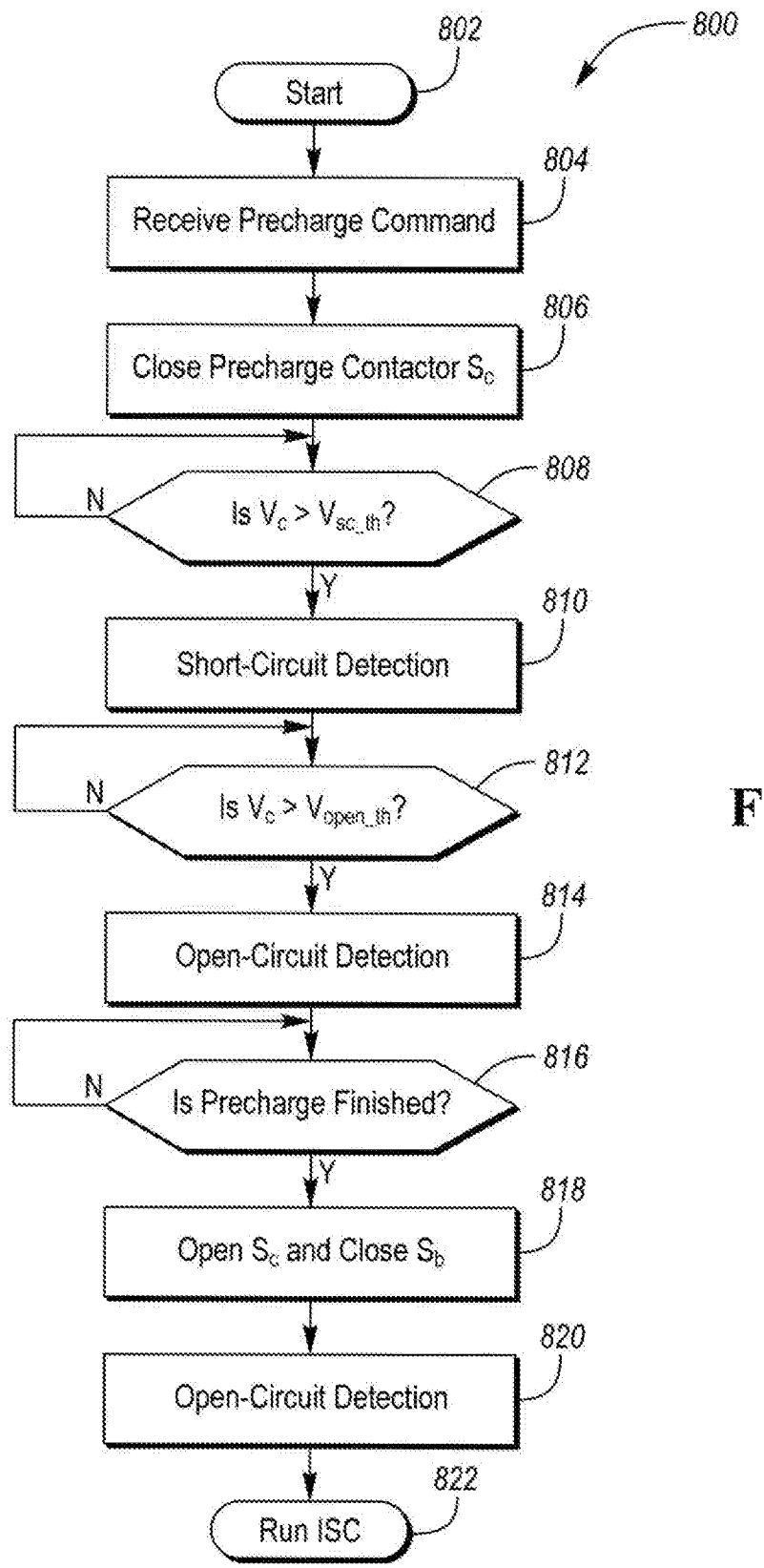
FIG. 9 is an algorithm for detecting short and open circuits.

FIG. 9 includes a flow diagram 800 that depicts an example algorithm for implementing the teachings of this disclosure. In step 802, the process begins. In step 804, the inverter controller 101 receives a command to close the pre-charge contactor 106. In step 806, the inverter controller 101 closes the pre-charge contactor 106. As $V_c$ 204 increases, the voltage is monitored until the $V_c$ 204 exceeds a short circuit test threshold. After $V_c$ 204 exceeds the threshold, the short circuit detection 200 is performed in step 810. The short circuit detection method may be the voltage detection method or the current detection method. The threshold may be based on sensory thresholds used to determine the voltage drop or current values to eliminate false positives or negatives. The controller 101 may monitor $V_c$ 204 until it exceeds an open circuit detection threshold. The open circuit threshold may be greater than or less than the short circuit threshold and the open circuit detection may be performed before or after the short circuit detection. When $V_c$ 204 exceeds the open circuit detection threshold, in step 812, the open circuit detection process 600 is performed in step 814. When $V_c$ 204 reaches plateau 206, the controller 101 determines that pre-charge is finished in step 816. In step 818, controller 101 opens the pre-charge contactor 106 and closes the main contactor 104. The controller 101 may run open circuit detection 600 after the main contactor 104 is closed in step 820.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle comprising:
   an inverter having a supply bus including a contactor operable to conduct current through a resistive element connected to a capacitive element having a voltage supplied by a battery; and
   a controller configured to, responsive to the voltage exceeding a threshold, energize a first gate of the inverter for a duration that is defined by the threshold, and detect current flow between a first phase associated with the gate and the bus based on a voltage drop associated with the voltage.

2. The vehicle of claim 1, wherein the duration is further defined by an expected voltage drop.

3. The vehicle. of claim 2, wherein the controller is further configured to energize a second gate of the inverter during the duration, and detect current flow between the first phase associated with the first gate and a second phase associated with the second gate based on the voltage drop associated with the voltage.

4. The vehicle of claim 2, wherein the controller is further configured to energize a second gate of the inverter after the duration, and detect current flow between a second phase associated with. the second gate and the bus based on a voltage drop associated with the voltage.

5. rhe vehicle of claim 2, wherein the controller is further configured to energize a second gate of the inverter during the duration and deenergize the second gate after expiration of the duration, and detect current flow between a second phase associated with the second gate and the bus and current flow between the first phase associated with the first gate and the second phase.

6. The vehicle of claim 1, wherein the controller is further configured to, responsive to the voltage reaching an operational plateau, energize a first gate pair of the inverter, and responsive to absence of current flowing through phases associated with the first gate pair, indicate a fault.

7. The vehicle of claim 6, wherein the first gate pair includes gates from different phases of the inverter.

8. The vehicle of claim 6, wherein the controller is further configured to energize a second gate pair and a third gate pair of the inverter, and responsive to absence of current through any two of the first gate pair, second gate pair, or third gate pair, indicate an open circuit fault phase based on a common phase associated with the pairs.

9. The vehicle of claim 6, wherein energization of the first gate pair is after the contactor is opened and a main switch is closed.

10. A vehicle comprising:
    an inverter having a bus including a contactor operable to conduct current through a resistive element connected to a capacitive element having a voltage supplied by a battery; and
    a controller configured to,
       responsive to the voltage reaching art operational plateau, energize a first gate pair of the inverter, and responsive to absence of current flowing through phases associated. with the first gate pair, indicate a fault, and
       responsive to the voltage exceeding a threshold, energize a first gate of the inverter, and detect current flow between a first phase associated with the gate and the bus, wherein the gate is energized for a. duration that is defined by a. value of the threshold then deenergized.

11. The vehicle of claim 10, wherein the first gate pair includes gates from different phases of the inverter.

12. The vehicle of claim 10, wherein the controller is further configured to energize a second gate pair and a third gate pair of the inverter, and responsive to absence of current through any two of the first gate pair, second gate pair, or third gate pair, indicate an open circuit fault phase based on a common phase associated with the pairs.

13. The vehicle of claim 10, wherein energization of the first gate pair is after the contactor is opened and a main switch is closed.

14. The vehicle of claim 10, wherein the controller is further configured to energize a second gate of the inverter during the duration, and detect current flow between the first phase associated with the first gate and a second phase associated with the second gate.

15. The vehicle of claim 10, wherein the controller is further configured to energize a second gate of the inverter after the duration, and detect current flow between a second phase associated with the second gate and the bus.

16. The vehicle of claim 10, wherein the controller is further configured to energize a second gate of the inverter during the duration and deenergize the second gate after expiration of the duration, and detect current flow between a second phase associated with the second gate and the bus and current flow between the first phase associated with the first gate and the second phase.

17. A vehicle comprising:
an inverter having a bus including a contactor operable to conduct current through a resistive element connected to a capacitive element having a voltage supplied by a battery; and
a controller configured to, responsive to the voltage exceeding a threshold, energize a first gate of the inverter for a duration that is defined by a value of the threshold, and detect current flow between a first phase associated with the gate and the bus based on a phase current of the first phase exceeding a predetermined threshold.

* * * * *